(12) United States Patent
Ballantine et al.

(10) Patent No.: US 6,339,018 B1
(45) Date of Patent: Jan. 15, 2002

(54) SILICIDE BLOCK BOUNDED DEVICE

(75) Inventors: Arne W. Ballantine, Cold Spring, NY (US); Terence B. Hook, Jericho Ceater, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/521,719

(22) Filed: Mar. 9, 2000

(51) Int. Cl.⁷ .................. H01L 21/3205; H01L 21/4763
(52) U.S. Cl. ............... 438/586; 438/58; 438/9; 257/385; 257/387; 257/389
(58) Field of Search ................. 438/586, 589; 257/387, 389, 385

(56) References Cited

U.S. PATENT DOCUMENTS

| | | | |
|---|---|---|---|
| 5,521,422 A | 5/1996 | Mandelman et al. | 257/510 |
| 5,629,544 A | 5/1997 | Voldman et al. | 257/355 |
| 5,741,738 A | 4/1998 | Mandelman et al. | 437/67 |
| 5,837,612 A | 11/1998 | Ajuria et al. | 438/697 |
| 6,097,070 A * | 2/1999 | Mandelman et al. | 257/389 |
| 6,190,971 B1 * | 5/1999 | Gruening et al. | 438/270 |

* cited by examiner

Primary Examiner—David Nelms
Assistant Examiner—Renee' R. Berry
(74) Attorney, Agent, or Firm—McGuireWoods, LLP; Mark F. Chadurjian

(57) ABSTRACT

A method and structure for preventing device leakage. The method and structure includes forming a blocking layer of preferably nitride over a junction between a source/drain region and a shallow trench isolation. A silicide is then formed over a landed area of the source/drain region but is blocked by the blocking layer from forming over the junction between the source/drain region and the shallow trench isolation. This prevents device leakage at this location.

13 Claims, 5 Drawing Sheets

SILICIDE BLOCK BOUNDED DEVICE

BACKGROUND OF THE INVENTION

1. Field of the Invention

The present invention generally relates to a method and structure for improving device characteristics and, more particularly, to a method and structure for preventing leakage at an interface (junction) formed between a Source/Drain (S/D) region and a shallow trench isolation (STI) region of a Field Effect Transistor (FET) or other similar device.

2. Background Description

Parasitic leakage paths have been known to occur in contemporary CMOS technologies which employ field effect transistors that are adjacent or bounded by trenches. The trenches may be filled with oxide in order to form isolation structures (shallow trench isolation (STI)) or may provide a location for semiconductor devices, such as, for example, capacitors.

More specifically, it has been found that parasitic leakage results when a divot or recess or both is formed at the interface between the STI oxide region and the Source/Drain (S/D) region (e.g., corner of the SID region adjacent to the STI oxide region). These divots or recesses result from the etching process which forms the STI oxide region.

The divots and recesses form an exposed edge at the corner of the S/D region (adjacent to the STI oxide region) such that a silicide formed on the top of the S/D region will also form on the exposed edge portion of the S/D region. This brings the silicide closer to the junction between the S/D and STI regions (e.g., at the edge of the S/D region adjacent to the STI region), resulting in a leakage path. Moreover, a relatively short path for potential leakage may further result when the S/D junction tilts upward at the interface between the S/D region and the STI region, as may occur from depletion or pile-up of the dopant during oxidation steps.

FIG. 1 illustrates the above situation. Specifically, in FIG. 1, the S/D region has a thickness of "A" and the junction depth adjacent to the STI region has a thickness of "B", where "B" is less than "A". (It is well known to one of ordinary skill in the art that STI region must be deeper than the S/D region.) In this manner, a recess is formed between the two regions. It is also seen that a divot is formed at the junction between the S/D region and the STI region. Both of these phenomenon result in the corner portion of the S/D region having an exposed corner or edge. This exposed corner or edge, in turn, brings the silicide closer to the junction between the S/D and STI regions causing leakage at this junction.

In other approaches, U.S. Pat. No. 5,837,612 to Ajuria, et al. shows a method for forming STI regions by forming an oxidizable layer made of polysilicon. An opening is patterned and etched through this layer to define and form the STI region. Silicon sidewalls of the trench and the polysilicon layer are then exposed to an oxidizing ambient to form a thermal oxide trench liner and an erosion-protection polysilicon-oxide layer. A trench fill material is then deposited and chemically and mechanically polished (CMP) utilizing the polysilicon layer as a polish stop. The final polished trench fill plug comprises an ozone TEOS bulk material and an annular peripheral upper erosion-protection portion formed of the polysilicon-oxide. However, this reference does not address the placement of a silicide layer which may contribute to the leakage problem, depending on the placement thereof.

U.S. Pat. No. 5,629,544 to Voldman, et al. shows a diode positioned in a well having trench isolation. Both the well contact of the diode and the rectifying contact of the diode are silicided, but the silicide on the rectifying contact is spaced from the trench isolation edge. The spacing is provided by a gate stack or other mask. In one embodiment, the gate stack alone spaces the two diode contacts from each other, eliminating the need for trench isolation. However, by using a gate stack for spacing the diode contacts, parasitic capacitance may increase at the S/D region to the polysilicon layer or shorts or other leakage may result, depending on the specific layout of the Voldman, et al. structure.

SUMMARY OF THE INVENTION

The present invention is directed to a method of forming a nitride layer at an interface between a Source/Drain (S/D) region and a shallow trench isolation (STI) region in order to prevent leakage on a device such as, for example, a Field Effect Transistor (FET). The present invention is also directed to the structure of the device.

The present invention includes etching a trench in a semiconductor wafer, and overfilling the trench with oxide. The oxide is then etched back or planarized forming either or both of a recess or a divot at the junction between the planarized oxide (STI region) and an S/D region (to be later formed). A gate oxide is thermally grown over both the substrate and the STI region, and a polysilicon gate is formed over the gate oxide layer, proximate to the STI region. In the preferred embodiment, a space is provided between the polysilicon gate and the STI region so that the S/D region can be properly positioned and formed at a later processing step.

A sidewall oxide layer is formed about the polysilicon gate. The formation of the sidewall oxide will also form a thin layer of oxide over the gate oxide and the STI region, but this thin layer is insignificant and will not affect the device of the present invention. The silicon substrate is then doped at the space between the STI region and the polysilicon gate to form the S/D region.

A blocking nitride layer is formed over the entire surface of the device. This includes forming the nitride layer over the (i) polysilicon gate region, (ii) the S/D region and (iii) the STI region, and most importantly over the interface or junction between the S/D region and the STI region where a divot or recess or both may exist. In one embodiment of the present invention, it is only necessary to form the nitride layer over the interface or junction between the S/D region and the STI region (e.g., over the divot or recess). The nitride layer prevents the formation of a silicide layer to form at the interface between the S/D region and the STI region thus preventing any leakage.

The nitride layer as well as the additional oxide layer is selectively etched, and a uniform layer of cobalt or titanium is then deposited on the device in order to form either cobalt silicide or titanium silicide over the landed or contact area of the S/D region. By using the nitride layer, silicide cannot form over the divots or recesses at the interface between the S/D region and the STI region. Instead, the nitride layer is provided at this interface, which blocks the formation of the silicide. Thus, leakage which would otherwise occur at this interface with prior art systems is prevented.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

In order to accomplish the objectives of the present invention, a blocking layer is formed at an interface or junction between a first type region and a second type region on a device such as, for example, a Field Effect Transistor (FET). This blocking layer will cover a divot or recess or both that may exist between the interface of the first and second type regions of a conventional FET or other similar device, thereby preventing silicide formation at this interface and any resulting leakage. Referring to at least FIGS. 3d–3f (discussed in more detail below) a divot 315 is formed at the junction of the STI region 310a and the S/D region 345, and a recess 315a is also formed between the STI region and the S/D region (thickness of "B" of the junction depth adjacent to the STI region is less than the thickness of "A" of the S/D region).

Specifically and in the preferred embodiment, the blocking layer is a nitride layer which is etched back so that a landed area is provided over an S/D region, but remains over the interface between the S/D region and an STI region. A silicide or other appropriate metal is then formed over the landed area of the S/D region; however, the silicide will not form over the interface between the S/D region and the STI region due to the presence of the nitride layer. Thus leakage that would otherwise occur between the interface of the S/D region and the STI region is now prevented by using the arrangement of the present invention.

Method of Formation of the Present Invention

Figure 2:
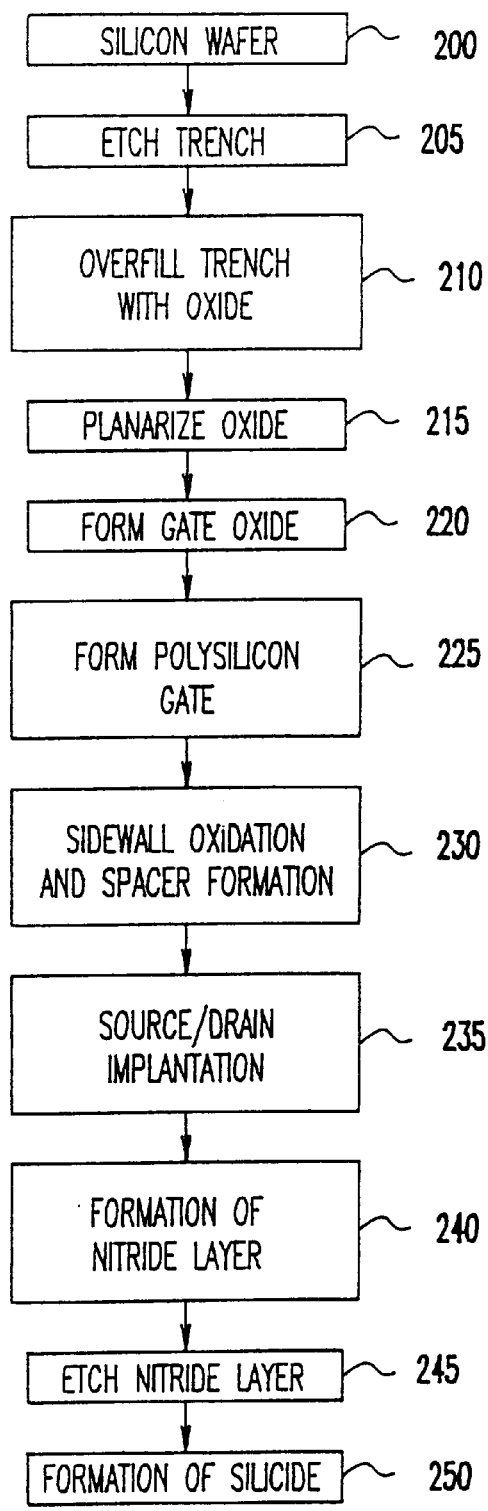
FIG. 2 shows a process flow of an exemplary fabrication process in accordance with an embodiment of the present invention.

Referring now to the drawings, and more particularly to FIG. 2, there is shown a flow diagram of one exemplary embodiment of a fabrication process in accordance with the present invention.

Specifically and now referencing FIG. 2, in process step 200, a semiconductor wafer substrate, preferably silicon, is provided. In process step 205, the silicon substrate is etched in order to form a trench structure. In the preferred embodiment, a reactive ion etch using fluorine containing compounds such as, for example, $CF_4$ or $NF_4$, is used to form the trench structure. The trench structure is preferably about 3000 Å deep; however, other etching processes and other trench depths are also contemplated for use with the present invention.

In process step 210, the trench structure is preferably overfilled with oxide (or other insulating material) to a thickness of approximately 2× the depth of the trench structure. That is, if the trench structure is 3000 Å, the oxide layer should then have a thickness of about 6000 Å. In process step 215, the oxide is planarized (polished back) by mechanical, chemical or reactive ion etching to a level near the semiconductor wafer substrate to form the STI region.

It is well known that a divot may result at the interface between the STI region and the adjacent portion of the bare silicon substrate (which will later be doped to form the S/D region) when the oxide is planarized to a level of the semiconductor wafer substrate. On the other hand, a recess will form at the STI region and an adjacent portion of the silicon substrate (which will later be doped to form the S/D region) when the oxide is planarized to a level below the semiconductor wafer substrate. It is further known that both a recess and a divot may form at the same time when the oxide is planarized to a level below the semiconductor wafer substrate. It should be well understood that the formation either a divot or a recess is due to the polishing or wet etching at the STI region. In any case, a corner or an edge is formed and exposed at the S/D region interface; that is where the recess or divot meets the S/D region.

In process step 220, a gate oxide is thermally grown over both the silicon substrate and the STI region. The gate oxide is preferably grown at a temperature of between 700° F. to 900° F. to a thickness of about between 20 Å to 70 Å.

In process step 225, a gate (preferably polysilicon) is formed over the gate oxide layer, proximate to the STI region. The polysilicon gate has a thickness of about 2000 Å to 3000 Å, and is typically formed by low pressure chemical vapor deposition (LPCVD). The polysilicon gate may be shaped by a photolithographic etch process selective to the oxide layer and using a flourinate containing compound similar to that used to etch the trench oxide layer. In the preferred embodiment, a space is provided between the polysilicon gate and the STI region so that the S/D region can be properly positioned and formed at a later processing step.

In process step 230, a sidewall oxidation process is provided to form an oxide layer of approximately 50 Å about the polysilicon gate. The formation of the sidewall oxide will also form a thin layer of oxide over the gate oxide and the STI region; however, the thickness of this oxide layer is insignificant and will not affect the device of the present invention. In conventional doping methods, a finger or extension is formed on the S/D region which extends to underneath the polysilicon gate. This finger is typically formed by well known implantation processes. An additional oxide or nitride layer is then formed on the surface of the entire structure which is then selectively etched to form a spacer. The spacer may be shaped as a ¼ circle or other desired shape.

In process step 235, the silicon substrate is doped at the space between the STI region and the polysilicon gate to form the S/D region. The S/D region can either be an NFET or a PFET depending on the use of the particular device. In the case of an NFET, arsenic or phosphorous is preferably used at a dopant concentration of $5 \times 10^{15}$ atoms/cm². In the case of a PFET, boron is preferably used at a dopant concentration of $5 \times 10^{15}$ atoms/cm². It should be understood that other dopants and dopant concentrations may equally be used when forming the S/D region.

In process step 240, a blocking layer of preferably nitride is formed over the surface of the device. In one embodiment, the blocking nitride layer is formed over the (i) polysilicon gate region, (ii) the S/D region and (iii) the STI region, and most importantly over the interface or junction between the S/D region and the STI region where a divot or recess or both may exist (e.g., the edge or corner of the S/D region adjacent to the STI region). In another embodiment of the present invention, it is only necessary to form the blocking nitride layer over the interface between the S/D region and the STI region (e.g., over the divot or recess portion which forms the edge or corner of the S/D region). In the preferred embodiment, the blocking nitride layer is deposited on the surface of the device using a PECVD process and has a uniform thickness of about 100 Å, but can be in the range from approximately 50 Å to 200 Å. As discussed, the blocking nitride layer prevents the formation of a metal layer, such as, for example, a silicide layer, to form at the interface between the S/D region and the STI region thus preventing any leakage.

In process step 245, the blocking nitride layer as well as any additional oxide layer is selectively etched, by preferably ion etching using a fluorine containing compound, over the S/D region (and polysilicon gate, if required). The etching is selective to the underlying oxide layer, similar to the selective etching of the polysilicon gate. The selective etching of process step 245 leaves a landing (e.g., contact area) over the S/D region and polysilicon gate; however, the contact area is slightly smaller than in conventional devices. The selective etching is not performed over the edge or corner of the S/D region adjacent to the STI region such that the nitride layer remains at this portion of the device.

In process step 250, a uniform layer of cobalt or titanium is then deposited on the device. The cobalt or titanium is then heated to approximately 600° F. in a nitrogen atmosphere for approximately one minute in order to form either cobalt silicide or titanium silicide. The unreacted cobalt or titanium is then etched using standard etch techniques in order to remover metal from regions other than the landed areas of the S/D region and polysilicon gate.

By using the method of the present invention, silicide cannot form over the divots or recesses at the interface between the S/D region and the STI region (e.g., corner or edge of the S/D region abutting the STI region). Instead, the nitride layer is provided at this interface, which blocks the formation of the silicide. Accordingly, the method of the present invention prevent leakage which would otherwise occur in prior art systems.

Device Structure of the Present Invention

Referring now to 3a–3f, the corresponding cross-sections of selected steps from the process flow diagram of FIG. 2 are now described.

Figure 1:
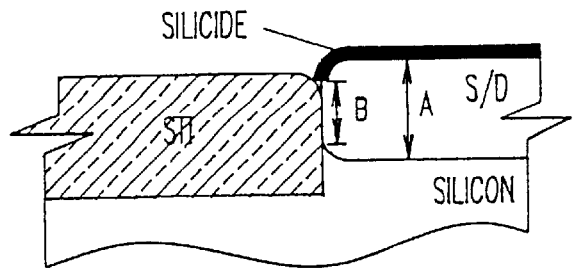
FIG. 1 shows a side view of a conventional Field Effect Transistor.
Figure 3D:
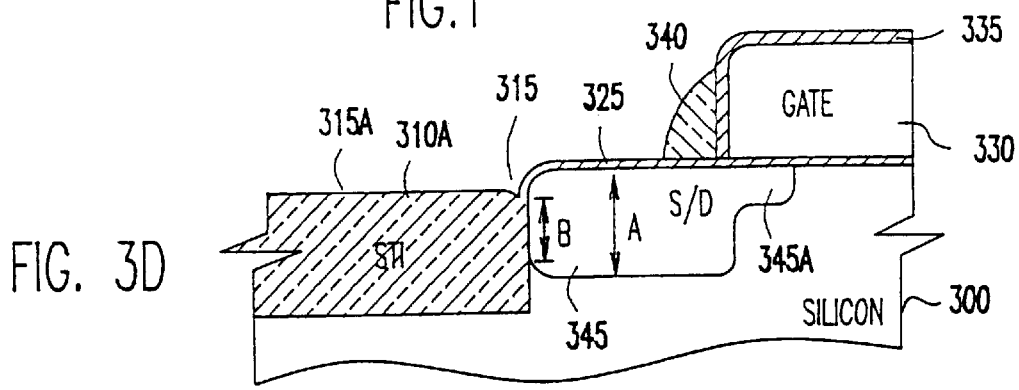
FIGS. 3a–3f show a side view of a device fabricated in accordance with the process of FIG. 2.
Figure 3E:
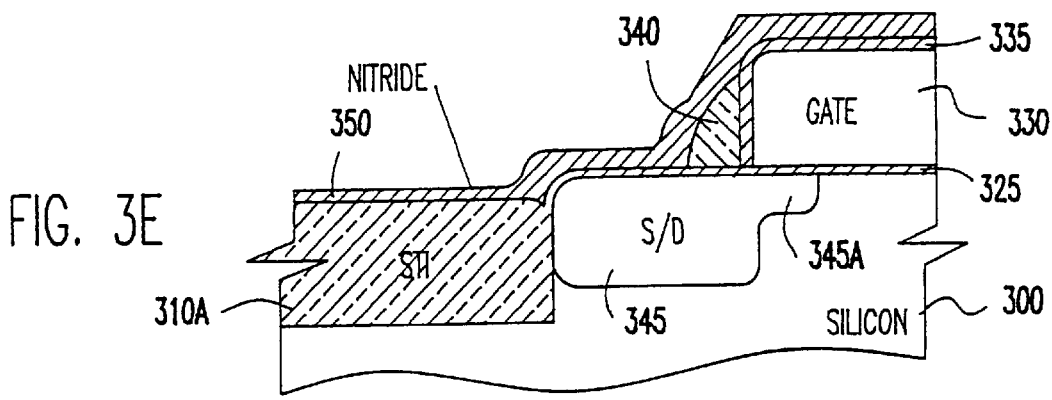
Figure 3F:
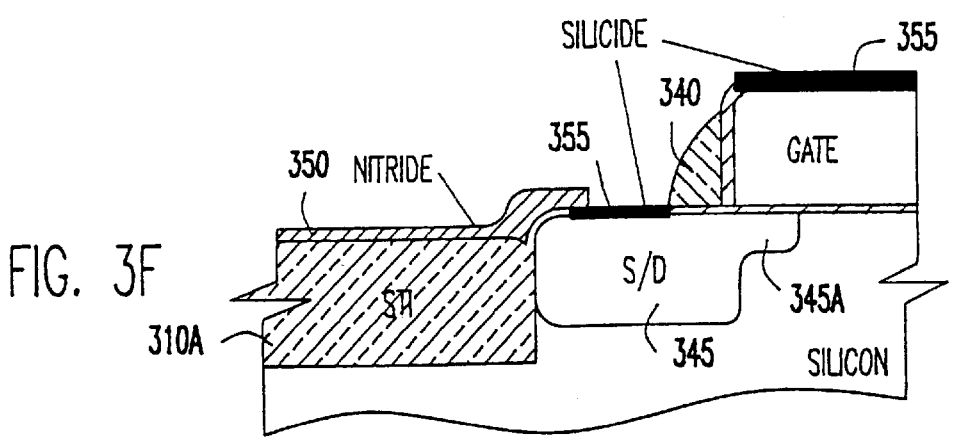
Figure 3A:
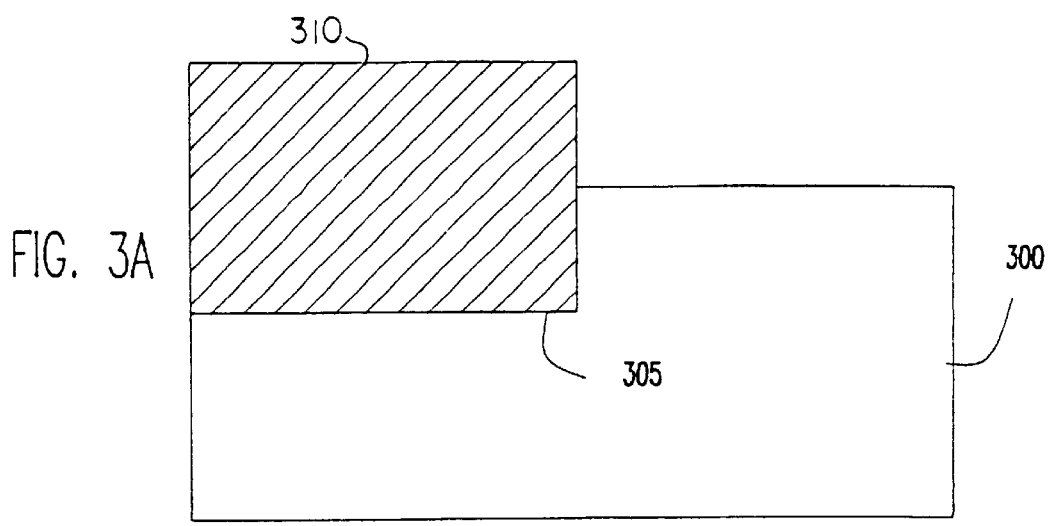

FIG. 3a shows a semiconductor substrate 300 having a trench structure 305 overfilled with oxide 310. In the preferred embodiment, the oxide 310 has a thickness of twice the depth of the trench structure 305.

Figure 3B:
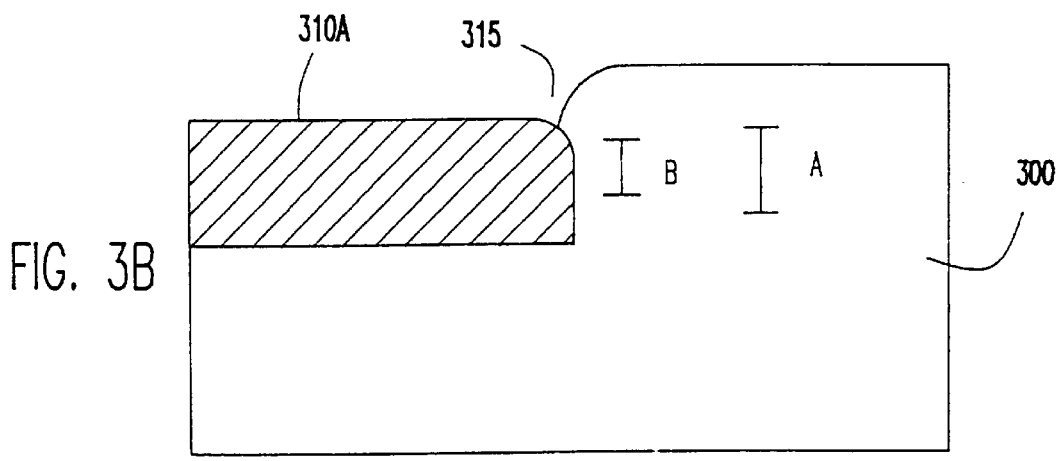

FIG. 3b shows the oxide 310 in the trench structure 305 after it is planarized by mechanical, chemical or reactive ion etching. This oxide filled trench forms the STI region 310a. At this stage, a recess is formed between the later formed S/D region which has a thickness of "A". The junction depth adjacent to the STI region then has a thickness of "B", where "B" is less than "A". In this manner, a recess is formed between the two regions. It is well understood that either a divot 315 or recess may be formed at the edge of the STI region 310a (depending on the etch process) and an adjacent portion of the silicon substrate 300 (to be later formed as the S/D region).

Figure 3C:
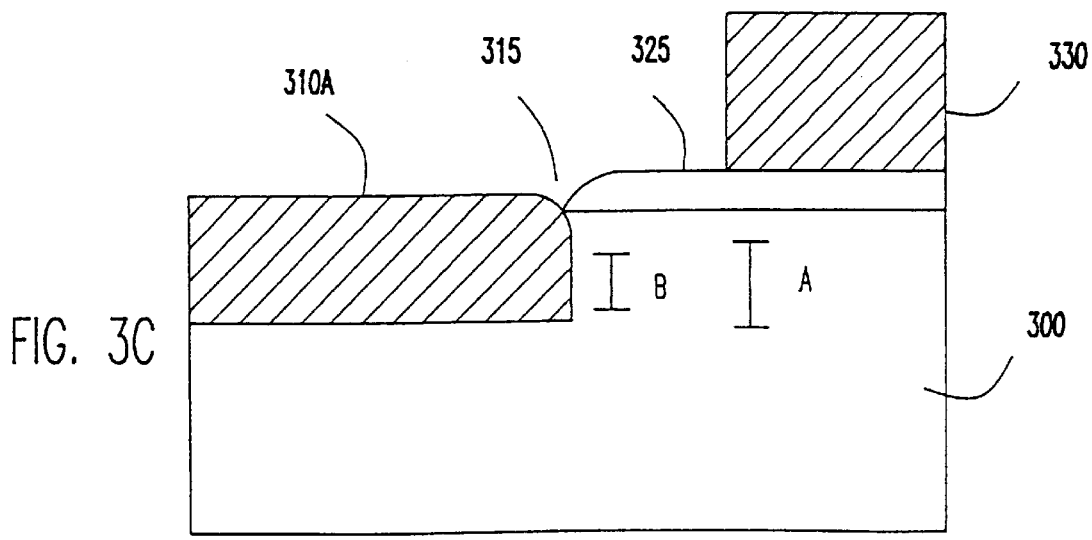

FIG. 3c shows the formation of a gate oxide layer 325 thermally grown over both the silicon substrate 300 and the STI region 310a. The thickness of the gate oxide layer 325 does not significantly affect the STI region 310a and is thus not shown at this region. FIG. 3c further shows a polysilicon gate 330 formed over the gate oxide layer 325, away from the STI region 310a. The polysilicon gate 330 preferably has a thickness of about 2000 Å to 3000 Å, and is formed by LPCVD.

FIG. 3d shows an oxide layer 335 of about 50 Å in thickness formed around the polysilicon gate 330. After the implantation of a source/drain extension or a lightly doped drain (LDD), an additional oxide or nitride layer may also be formed on the surface of the entire structure which will be selectively etched to form a spacer 340. FIG. 3d also shows the S/D region 345, and both the divot 315 formed between the S/D region and the STI region and a recess 315a (thickness "B" is less than thickness "A").

FIG. 3e shows the nitride layer 350 formed over the entire surface of the device, and FIG. 3f shows the silicide layer 355 formed on the landed areas of the S/D region 345 and the polysilicon gate 330 after the blocking nitride layer 350 is selectively etched using a mask process. As seen in both FIGS. 3e and 3f (as well as FIG. 3d), the polysilicon gate 330 is spaced apart from the STI region 310a as well as the landed portion of the S/D region 345. FIGS. 3e and 3f (as well as FIG. 3d) also show a finger or extension 345a extending from the S/D region 345 to underneath the polysilicon gate 330. Between the S/D region 345 and the polysilicon gate 330 is the spacer 340.

Figure 4:
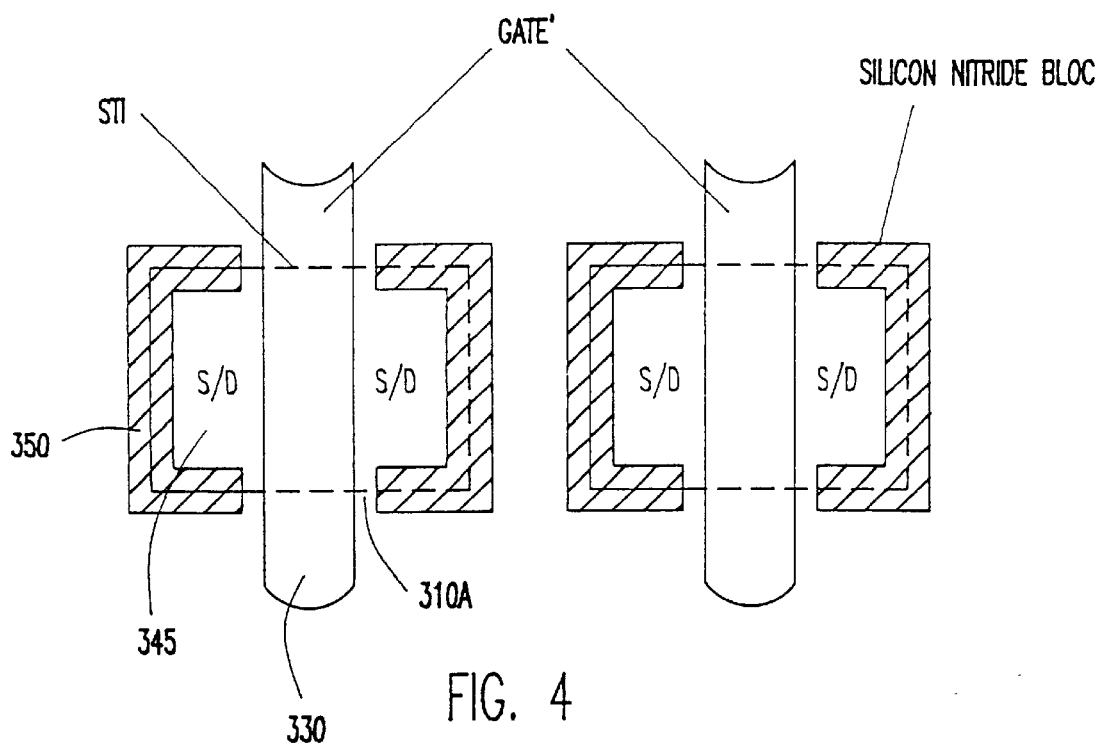
FIG. 4 shows a plan view of one embodiment of the present invention using a nitride layer over an interface between a Source/Drain (S/D) region and a shallow trench isolation (STI) region.

FIG. 4 shows a plan view of an embodiment using the nitride layer 350 of the present invention. In this embodiment, the nitride layer 350 is formed only over the interface of the S/D region 345 and the STI region 310a. That is, the nitride layer remains at the edge or corner of the S/D region adjacent to the STI region.

Figure 5:
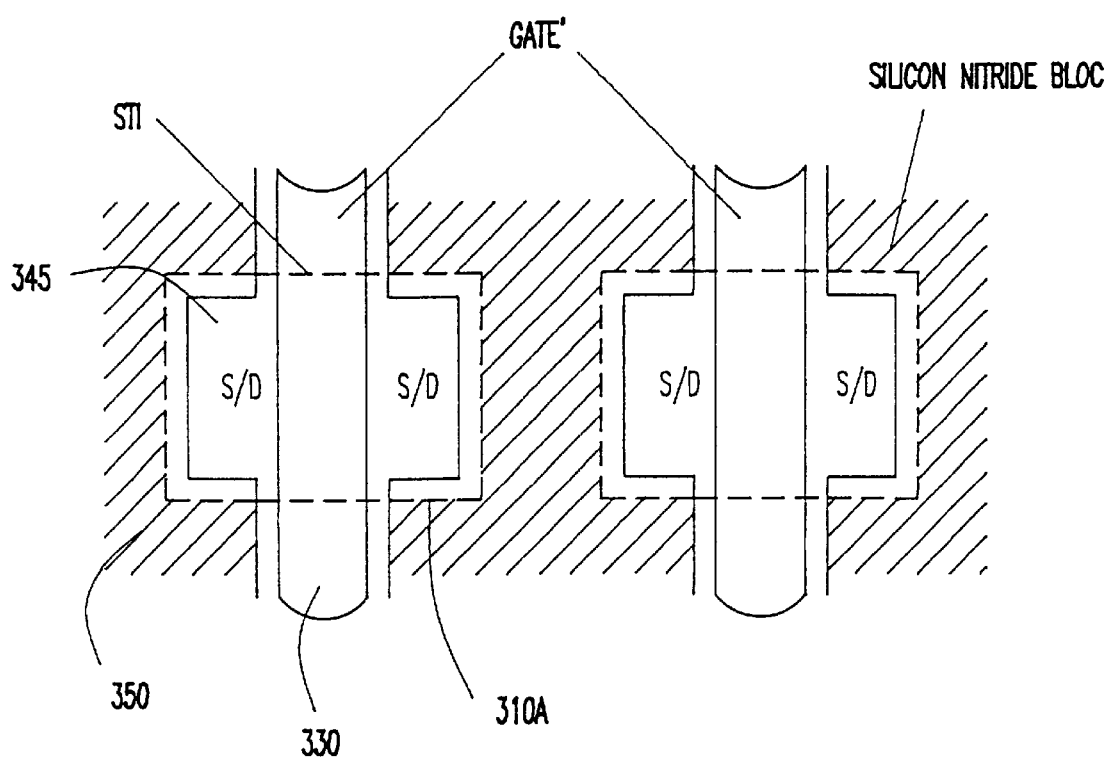
FIG. 5 shows a plan view of one embodiment of the present invention using a nitride layer over the STI region and the interface between the S/D region and the STI region.

FIG. 5 shows a plan view of another embodiment of the present invention. In this embodiment, the blocking layer 350, preferably nitride, remains over the entire surface of the device including the interface of the S/D region 345 and the STI region 310a. The embodiment of FIG. 5 provides for tighter packing of devices as the mask dimensions need not be as small as in FIG. 4.

Figure 6:
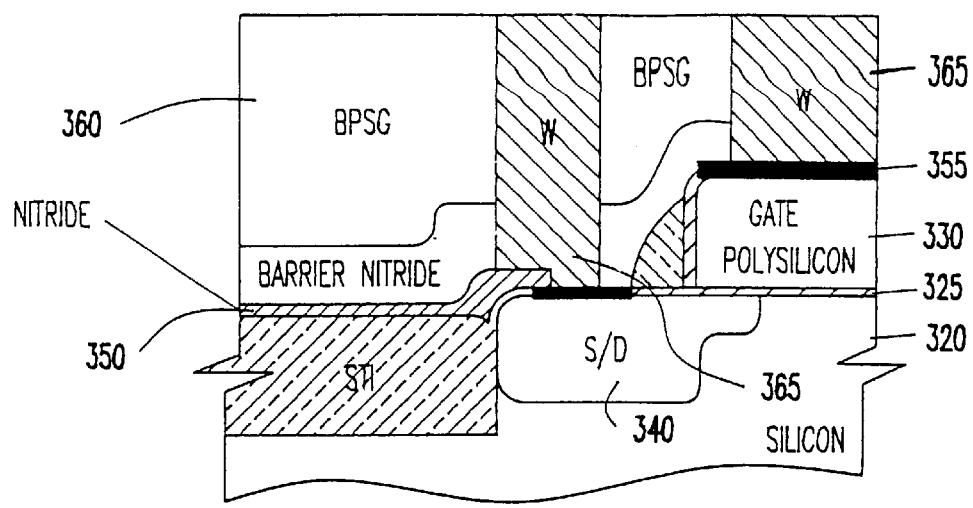
FIG. 6 shows a cross sectional view of a device implementing the structure of the present invention.

FIG. 6 shows a device using the nitride layer of the present invention. In this Figure, a BPSG layer 360 is provided over the nitride layer 350 and tungsten contacts 365 are formed over the landed S/D region 345 and polysilicon gate 330. Contact wires (not shown) may be connected to the tungsten contacts 365.

Figure 7:
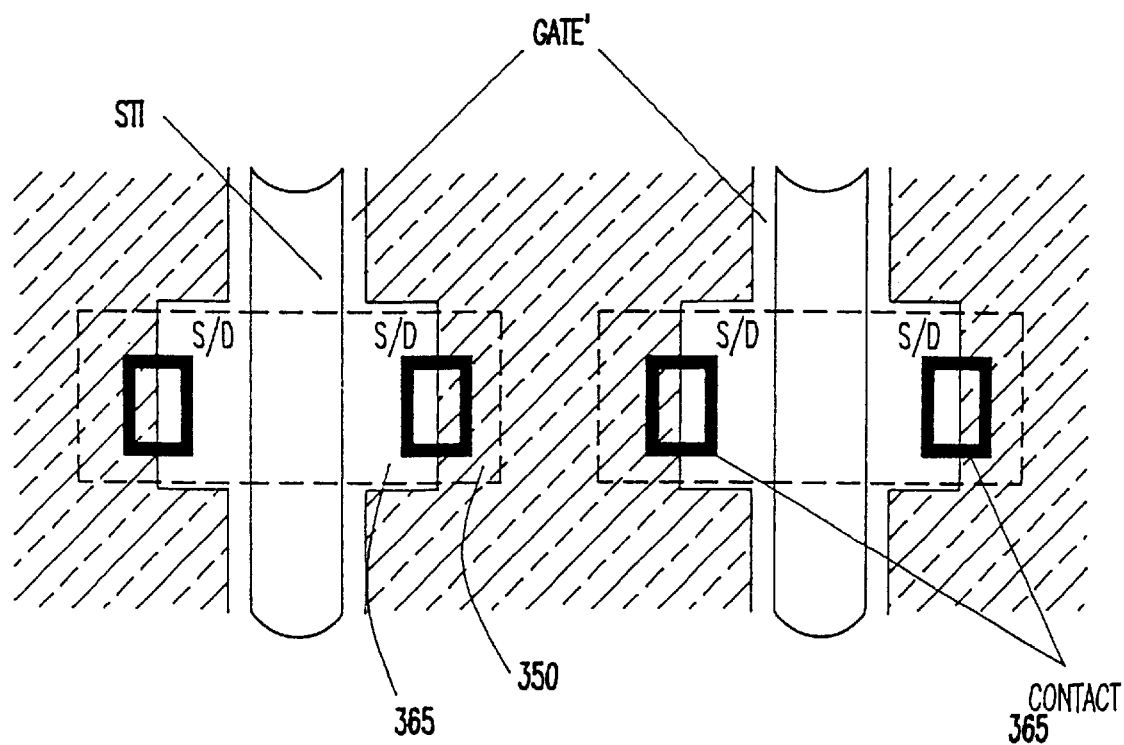
FIG. 7 shows a plan view of the device of FIG. 6.

FIG. 7 shows a plan view of the device of FIG. 6. As seen in FIG. 7, the tungsten contacts 365 extend over the S/D region 340 and the nitride layer 350 at the interface between the S/D region 340 and the STI region 310a, but the important current path from the edge of the contact to the edge of the gate is not interrupted and therefore performance will not be degraded while the leakage is minimized.

The implementation of the invention includes the use of a chip circuit layout macro which will maximize coverage of the wafer surface with the blocking layer. This layout algorithm will block all regions except those regions where the blocking layer would limit critical current flow. By doing this, the algorithm will obtain the maximum reduction in leakage allowed without degrade in device performance.

The macro would select to block the active region to insulator region interface on the back sides of contacts, because the reduction in silicided area on these regions would not significantly reduce series resistance, or reduce device performance. On the other hand, the macro would not block the active region on the sides of a minimum width device between the source and drain contacts and the gate because the narrowing of the silicided region in these areas would increase series resistance and therefore reduce device performance.

While the invention has been described in terms of preferred embodiments, those skilled in the art will recognize that the invention can be practiced with modification within the spirit and scope of the appended claims. For example, the STI region and the S/D region can be any type of first and second doped regions, and the nitride layer can be any appropriate blocking layer capable of being used with the present invention.

Having thus described our invention, what we claim as new and desire to secure by Letters Patent is as follows:

1. A method of preventing leakage at an interface between a first type region and a second type region, the method comprising:

forming a blocking layer on the first type region, the second type region and the interface between the first type region and the second type region; and etching the blocking layer on a portion of the first type region, the blocking layer remaining on at least the interface, wherein the blocking layer blocks formation of a metal layer on the recess or the divot or both thereby preventing leakage.

2. The method of claim 1, wherein the etching of the blocking layer forms a contact area over the first type region so that the metal layer can be formed on the contact area.

3. The method of claim 1, further comprising:

forming an insulating layer between the first type region and the blocking layer, wherein the insulating layer forms around a corner of the first type region created by the recess or the divot; and etching the insulating layer over the first type region with the etching step of the blocking layer, wherein the blocking layer blocks formation of the metal layer at the corner.

4. The method of claim 1, wherein the blocking layer is formed at a uniform thickness.

5. The method of claim 4, wherein the uniform thickness of the blocking layer is formed at approximately between 50 Å to 200 Å.

6. The method of claim 1, further comprising:

forming an oxide layer between the first type region and the blocking layer;

forming a gate over the insulating layer adjacent to the first type region;

etching the insulating layer over the first type region with the etching step of the blocking layer, wherein the etching of the insulating layer and the blocking layer forms contact areas over the gate and the first type region.

7. The method of claim 6, further comprising forming the metal layer on the gate.

8. The method of claim 6, further comprising forming a spacer between the gate and the first type region.

9. The method of claim 6, wherein the insulating layer is an oxide layer formed at a thickness of approximately 50 Å.

10. The method of claim 6, wherein the gate is polysilicon formed at a thickness of approximately between 2000 Å to 3000 Å.

11. The method of claim 1, further comprising forming a contact plug on the metal layer.

12. The method of claim 13, wherein the contact plug is also formed on a portion of the blocking layer.

13. The method of claim 1, wherein the blocking layer is a nitride layer and the metal layer is a silicide layer selected from the group consisting of titanium silicide and cobalt silicide.

* * * * *